United States Patent [19]

Arimoto et al.

[11] Patent Number: 4,829,484

[45] Date of Patent: May 9, 1989

[54] SEMICONDUCTOR MEMORY DEVICE HAVING SELF-REFRESH FUNCTION

[75] Inventors: Kazutami Arimoto; Kiyohiro Furutani, both of Hyogo-ken, Japan

[73] Assignee: Mitsubishi Denki Kabushiki Kaisha, Tokyo, Japan

[21] Appl. No.: 173,746

[22] Filed: Mar. 25, 1988

[30] Foreign Application Priority Data

Apr. 1, 1987 [JP] Japan .................................. 62-81612

[51] Int. Cl.[4] .......................... G11C 7/00; G11C 11/40
[52] U.S. Cl. ................................. 365/222; 365/189.05
[58] Field of Search ......................... 365/189, 222, 207

[56] References Cited

U.S. PATENT DOCUMENTS

| 4,344,157 | 8/1982 | White, Jr. et al. | 365/222 |
| 4,376,988 | 3/1983 | Ludwig et al. | 365/222 |
| 4,542,483 | 9/1985 | Procyk | 365/203 X |
| 4,625,296 | 11/1986 | Shriver | 365/222 X |
| 4,636,989 | 1/1987 | Ikuzaki | 365/222 |

OTHER PUBLICATIONS

IEEE J. of Sol. St. Circuits: "1Mbit Virtually Static RAM", by K. Nogami et al., vol. SC-21, No. 5, Oct. 1986, pp. 662-667.
ISSCC 86: "A 1Mb Virtually SRAM", by T. Sakurai et al., Feb. 21, 1986, pp. 252, 253 & 364.

Primary Examiner—Stuart N. Hecker
Assistant Examiner—Alyssa H. Bowler
Attorney, Agent, or Firm—Lowe, Price, Leblanc, Becker & Shur

[57] ABSTRACT

A virtually static RAM comprises a sense amplifier for a normal access operation and a refresh sense amplifier for a refresh operation. The sense amplifier operates at the time of the normal access operation and the refresh sense amplifier operates at the time of the refresh operation. When the normal access is required during the refresh operation, the refresh operation is interrupted with data read out from memory cells by the refresh operation being held in the refresh sense amplifier, and then the normal access operation is performed. After the normal access operation is completed, the refresh operation is resumed.

8 Claims, 6 Drawing Sheets

SEMICONDUCTOR MEMORY DEVICE HAVING SELF-REFRESH FUNCTION

BACKGROUND OF THE INVENTION

1. Field of the Invention

The present invention relates to a semiconductor memory device having a self-refresh function and more particularly, to an improvement of a background refresh system.

2. Description of the Prior Art

As a semiconductor memory device having a self-refresh function, a virtually static random access memory (referred to as VSRAM hereinafter) has been known. In the VSRAM, a static random access memory (static RAM) is substantially achieved using memory cells used for a dynamic random access memeory (dynamic RAM). More specifically, each of the memory cells in the VSRAM comprises a single MOSFET (metal oxide semiconductor field effect transistor) and a single capacitor, and a refresh operation for the memory cell is performed on a chip. Consequently, the user need not prepare a circuit for the refresh operation and the user is relieved of the burden.

Figure 1:
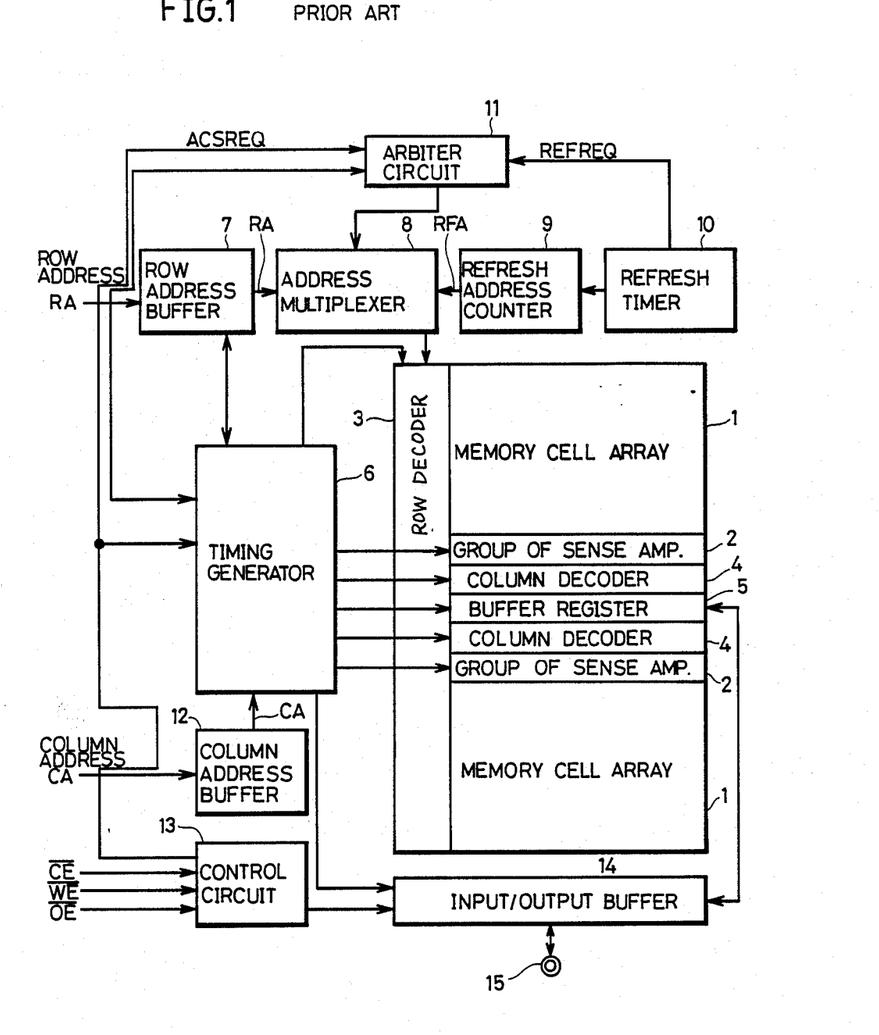
FIG. 1 is a block diagram showing a structure of a conventional VSRAM.

FIG. 1 is a block diagram showing a conventional example of such a VSRAM. The VSRAM is described in, for example, an article, by K. Nogami et al., entitled "1-M bit Virtually Static RAM", IEEE J. Solid-State Circuits, Vol. SC-21, No. 5, October 1986 and an article by T. Sakurai et al., "A 1Mb virtually SRAM", IEEE 1986 International Solid-State Circuits Conference, February 1986, Digest of Technical Papers, pp. 252-253 and p. 364.

Figure 2:
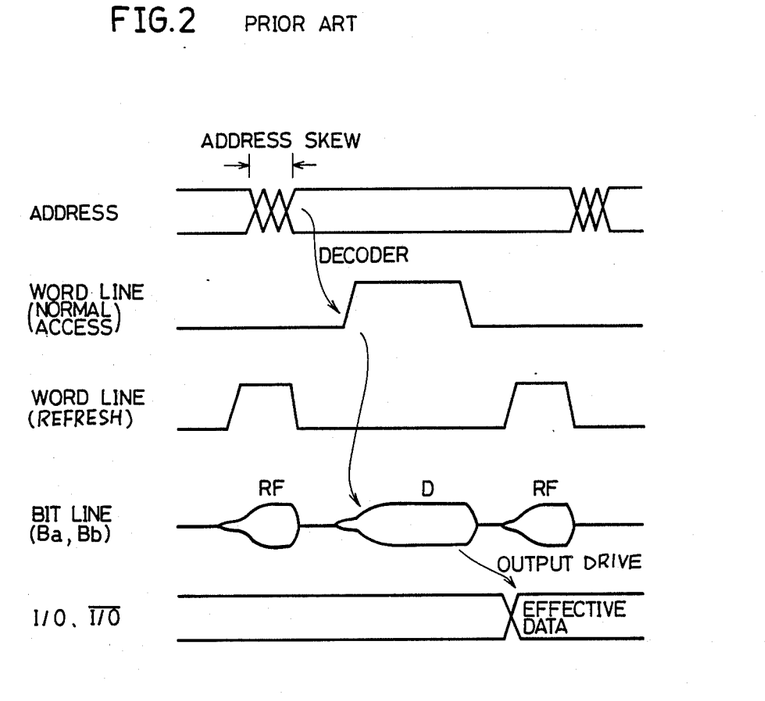
FIG. 2 is a timing chart for explaining an operation of the VSRAM shown in FIG. 1.

Referring to FIG. 1, each of memory cell arrays 1 comprise a plurality of memory cells arranged in a plurality of rows and columns. Word lines are provided corresponding to rows in the memory cell array 1, respectively and bit lines are provided corresponding to columns in the memory cell array 1, respectively. When a normal access, that is, an access for reading or writing data is made to the memory cells, a normal access request signal ACSREQ is applied to an arbiter circuit 11 from a control circuit 13 and a row address signal RA and a column address signal CA are applied to a row address buffer 7 and a column address buffer 12, respectively, from an exterior at timing as shown in FIG. 2. The row address signal RA buffered by the row address buffer 7 is applied to an address multiplexer 8. When a refresh operation is not performed, the arbiter circuit 11 is responsive to the normal access request signal ACSREQ for switching the address multiplexer 8 such that the row address signal RA is applied to a row decoder 3. The row decoder 3 decodes the row address signal RA, selects a single word line in the memory cell array 1 and raises a potential on the word line to a high level (see FIG. 2). Consequently, data are read out to corresponding bit lines from memory cells in one row connected to the selected word line. The data on the bit lines are detected and amplified by sense amplifiers included in the group 2 of sense amplifiers, respectively. As a result, potentials on the bit lines attain a high level or a low level as represented by D in FIG. 2.

On the other hand, the column address signal CA buffered by the column address buffer 12 is applied to a column decoder 4 through a timing generator 6. The column decoder 4 decodes the column address signal CA and selects one column in the memory cell array 1. Data on a bit line corresponding to the column is held once in a buffer register 5 and then, outputted to an input/output pin 15 through an input/output buffer 14 as effective data. The buffer register 5 is provided to release memory cells earlier from a normal access by transferring data in the memory cells to the buffer register 5 thereby to increase the refreshable time period.

The refresh operation of the VSRAM is performed in the time period during which the word lines, the memory cells, the group 2 of sense amplifiers and the like are not employed by the normal access. Such a time period is, for example, the address skew time period, the address decoding time period and the output circuit driving time period in the normal access. The refresh operation must be performed before data stored in each of the memory cells disappears with the lapse of time. A refresh timer 10 measures the time period corresponding to the time period during which data stored in the memory cell can be held, and applies a refresh request signal REFREQ to the arbiter circuit 11 and a refresh address counter 9 when a refresh operation is required. The refresh address counter 9 is responsive to the refresh request signal REFREQ for applying a refresh address signal RFA corresponding to a row to be refreshed in the memory cell array 1 to the address multiplexer 8. When the memory cell is released from the normal access, the arbiter circuit 11 switches the address multiplexer 8 such that the refresh address signal RFA is applied to the row decoder 3. The row decoder 3 is responsive to the refresh address signal RFA for selecting a single word line in the memory cell array 1 and raising a potential on the word line to a high level as shown in FIG. 2. Data are read out to corresponding bit lines from memory cells in one row connected to the selected word line, respectively, and detected and amplified by the sense amplifiers included in the group 2 of sense amplifiers, respectively. Consequently, potentials on the bit lines attain a high level or a low level as represented by RF in FIG. 2. A potential on the word line falls to a low level, so that the data on the bit lines are held again in the memory cells. In the above described manner, a refresh operation of memory cells is performed.

On the other hand, if the refresh request signal REFREQ is applied from the refresh timer 10 when a normal access operation is performed for memory cells, the arbiter circuit 11 delays a refresh operation until the normal access operation is completed. The arbiter circuit 11 enables the refresh operation after the memory cells are released from the normal access. On the other hand, if the normal access request signal ACSREQ is applied from the control circuit 13 when a refresh operation is performed, the arbiter circuit 11 enables a normal access operation after the memory cells are released from the refresh operation. In this case, considering that the refresh operation and the normal access operation conflicts, the refresh operation must be performed before the data in the memory cells disappear.

The conventional VSRAM has the above described structure. Thus, if a normal access request and a refresh request conflict, the other operation must be delayed until memory cells are released from one operation. Particularly, if a normal access operation is required during a refresh operation, the normal access operation enters the waiting state, so that the access time is longer by the refresh time period. The refresh time period is the sum of the time period required for raising the potentials on the word lines by the row decoder 3 and the time period required for amplification by the sense amplifiers.

On the other hand, if and when the above described conflict does not occur, the access time is relatively shorter. Thus, the access time is substantially changed depending on the presence or absence of conflict, so that the access time can not be made uniform.

A technique is considered in which a refresh operation is performed until a decoding operation for the next normal access is started after data is transferred to the buffer register 5. However, in this case, the time period for the refresh operation must be ensured in advance from one normal access to the next normal access. Consequently, viewed from the exterior of the VSRAM, it means that the access time in the normal access becomes substantially longer. Accordingly, the cycle time is longer as a whole. Meanwhile, in a semiconductor memory device other than the semiconductor memory device of a self-refresh type, an approach of adjusting timing outside the semiconductor memory device is taken. However, in the self-refresh type semiconductor memory device, such an approach can not be taken.

Thus, in the conventional self-refresh type semiconductor memory device, since the access time becomes longer when a normal access operation and a refresh operation conflict, the access time becomes nonuniform. In order to avoid the nonuniformity, the access time becomes longer when conflict does not occur. Consequently, high speed access by reducing the access time in the normal access and thus, the cycle time uniformly, can not be achieved.

SUMMARY OF THE INVENTION

A primary object of the present invention is to provide a semiconductor memory device having a refresh function in which the access time in the normal access is uniformly reduced so that high speed across time can be achieved.

In order to attain the above described object, the semiconductor memory device having a refresh function comprises a plurality of memory cells, access means including a first sense amplifier for making a normal access to the memory cells, the first sense amplifier being activated at the time of the normal access to amplify data read out from the memory cells, refresh means including a second sense amplifier for performing a refresh operation for the memory cells, the second sense amplifier being activated at the time of the refresh operation to amplify the data read out from the memory cells, refresh request means for generating a refresh request signal, normal access request means for generating a normal access request signal, refresh operation starting means responsive to the refresh request signal for operating the refresh means when the memory cells are released from the normal access by the normal access means, refresh operation interrupting means for interrupting the operation of the refresh means and operating the normal access means when the normal access request signal is applied during the operation of the refresh means, and data destruction preventing means for holding the data read out from the memory cells in the second sense amplifier such that the data is not destroyed when the operation of the refresh means is interrupted by the refresh operation interrupting means.

In the semiconductor memory device according to the present invention, only when the memory cells are released from the normal access, the refresh operation is started. Thus, the normal access and the refresh operation conflict less frequently. In addition, when the normal access is required during the refresh operation, the refresh operation is interrupted, so that the normal access is made. In such a case, the data read out from the memory cells at the time of the refresh operation is held in a second sense amplifier for a refresh operation, so that the data is not destroyed. Consequently, the normal access need not be delayed until the refresh operation is completed.

Thus, according to the present invention, normal access priority processing and data destruction preventing processing during interruption of the refresh operation are performed, so that the access time in the normal access is uniformly reduced. As a result, high speed access can be achieved.

These objects and other objects, features, aspects and advantages of the present invention will become more apparent from the following detailed description of the present invention when taken in conjunction with the accompaying drawings.

DESCRIPTION OF THE PREFERRED EMBODIMENT

Figure 3:
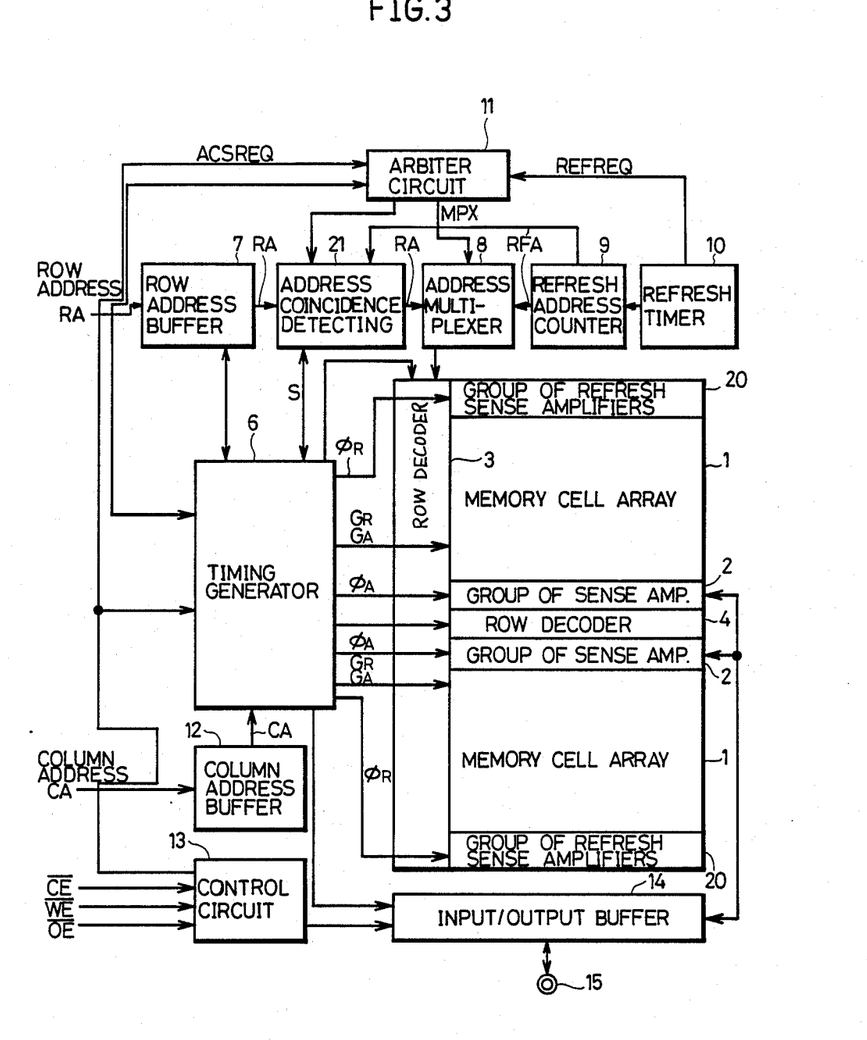
FIG. 3 is a block diagram showing a structure of a VSRAM according to an embodiment of the present invention.

FIG. 3 is a block diagram showing a structure of a VSRAM according to an embodiment of the present invention.

Referring to FIG. 3, each of memory cell arrays 1 comprises a plurality of memory cell arranged in a plurality of rows and columns. The memory cell array 1 is provided with a group 2 of sense amplifiers and a group 20 of refresh sense amplifiers. Sense amplifiers included in the group 2 of sense amplifiers are activated at the time of a normal access, and sense amplifiers included in the group 20 of refresh sense amplifiers are activated at the time of a refresh operation. More specifically, in the VSRAM, a sense amplifier for a normal access and a sense amplifier for a refresh operation are separately provided. The group 20 of refresh sense amplifiers is newly provided but a buffer register 5 provided in the conventional VSRAM shown in FIG. 1 is not provided.

In addition, the VSRAM comprises a row decoder 3 for selecting one row in the memory cell array 1 and a column decoder 4 for selecting one column therein. A row address signal RA is applied to the row decoder 3 through a row address buffer 7, an address coincidence detecting circuit 21 and an address multiplexer 8. A refresh address signal RFA is applied to the row decoder 3 and the address coincidence detecting circuit 21 from a refresh address counter 9 through the address multiplexer 8.

An arbiter circuit 11 is responsive to a normal access request signal ACSREQ and a refresh request signal REFREQ for applying a multiplex signal MPX for commanding a normal access or a refresh operation to the address multiplexer 8. However, an operation rule of the arbiter circuit 11, which is different from that in the conventional VSRAM, is a rule that priority is given to the normal access request signal ACSREQ. More specifically, while the normal access is made by the normal access request signal ACSREQ, the arbiter circuit 11 controls the address multiplexer 8 such that the row address signal RA is applied to the row decoder 3 not to perform the refresh operation. In addition, when the normal access request signal ACSREQ is applied during the refresh operation, the arbiter circuit 11 forcedly switches the address multiplexer 8 such that the row address signal RA from the address coincidence detecting circuit 21 is applied to the row decoder 3 to interrupt the refresh operation and enable the normal access operation. In the above described manner, the normal access operation is performed. After a memory cell is released from the normal access, the arbiter circuit 11 switches again the address multiplexer 8 such that the refresh address signal RFA from the refresh address counter 9 is applied to the row decoder 3 to resume the interrupted refresh operation.

Meanwhile, an operation timing signal required for the operations is generated from the timing generator 6 receiving a signal from the arbiter circuit 11 and applied to the group 2 of sense amplifiers, the group 20 of refresh sense amplifiers and the like.

On the other hand, if a normal access request and a refresh request conflict, the address coincidence detecting circuit 21 determines whether or not the row address signal RA applied from the row address buffer 7 and the refresh address signal RFA applied from the refresh address counter 9 coincide with each other. When the row address signal RA and the refresh address signal RFA coincide with each other, a coincidence signal S is applied to the timing generator 6. The timing generator 6 is responsive to the coincidence signal S for transferring data from the group 20 of refresh sense amplifiers to the group 2 of sense amplifiers.

On the other hand, a column address signal CA is applied to a column decoder 4 through a column address buffer 12 and the timing generator 6. In addition, an input/output buffer 14 outputs data amplified by the group 2 of sense amplifiers to an input/output pin 15 or inputs the data applied to the input/output pin 15 to the memory cell arrays 1. An operation of each of the portions is controlled by a control circuit 13 and the timing generator 6.

Figure 4:
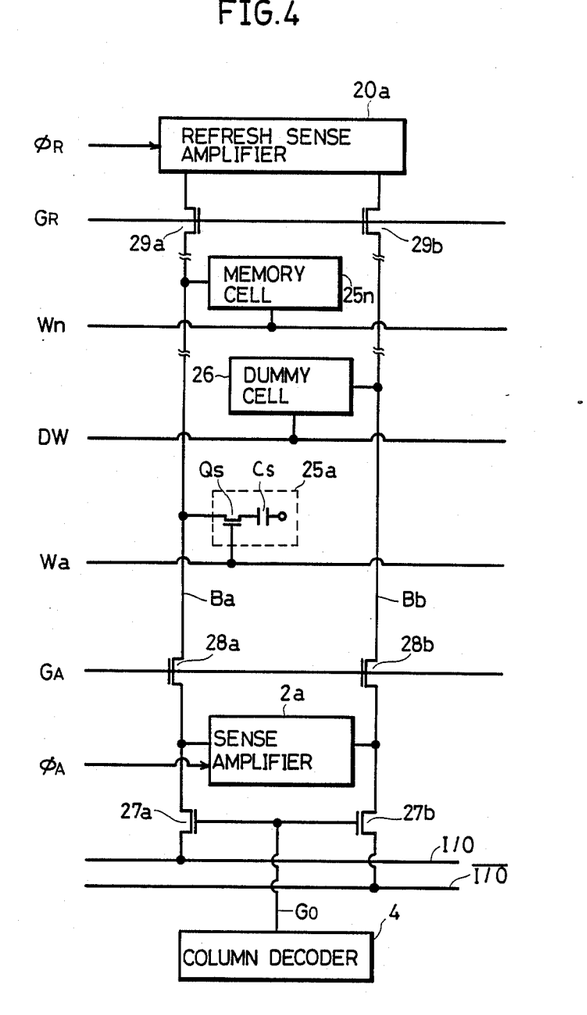
FIG. 4 is a circuit diagram showing a structure of a portion of one column of a memory cell array included in the VSRAM shown in FIG. 3.

FIG. 4 is a circuit diagram showing a portion of one column in the memory cell array 1 shown in FIG. 3 and a part of the peripheral circuit thereof.

Referring to FIG. 4, memory cells 25a to 25n are provided at intersections of a bit line Ba and word lines Wa to Wn, and a dummy cell 26 is provided at an intersection of a bit line Bb and a dummy word line DW. The memory cell 25a comprises a single MOSFET Qs and a single capacitor Cs. The capacitor Cs is connected to the bit line Ba through the MOSFET Qs. The MOSFET Qs has its gate connected to the word line Wa. The other memory cells and the dummy cell have the same structure. The bit lines Ba and Bb are connected to one terminal and the other terminal of a sense amplifier 2a through switching transistors 28a and 28b, respectively. The switching transistors 28a and 28b have their gates receiving a gate signal $G_A$ from the timing generator 6 (in FIG. 3). In addition, one terminal and the other terminal of the sense amplifier 2a are connected to I/O lines I/O and $\overline{I/O}$ through I/O gate transistors 27a and 27b, respectively. The I/O gate transistors 27a and 27b have their gates receiving a gate signal $G_O$ by the column decoder 4 (in FIG. 3). Furthermore, the bit lines Ba and Bb are connected to a refresh sense amplifier 20a through switching transistors 29a and 29b, respectively. The switching transistors 29a and 29b have their gates receiving a gate signal $G_R$ by the timing generator 6. Activating signals $\phi_A$ and $\phi_R$ are applied to the sense amplifier 2a and the refresh sense amplifier 20a by the timing generator 6, respectively.

Figure 5:
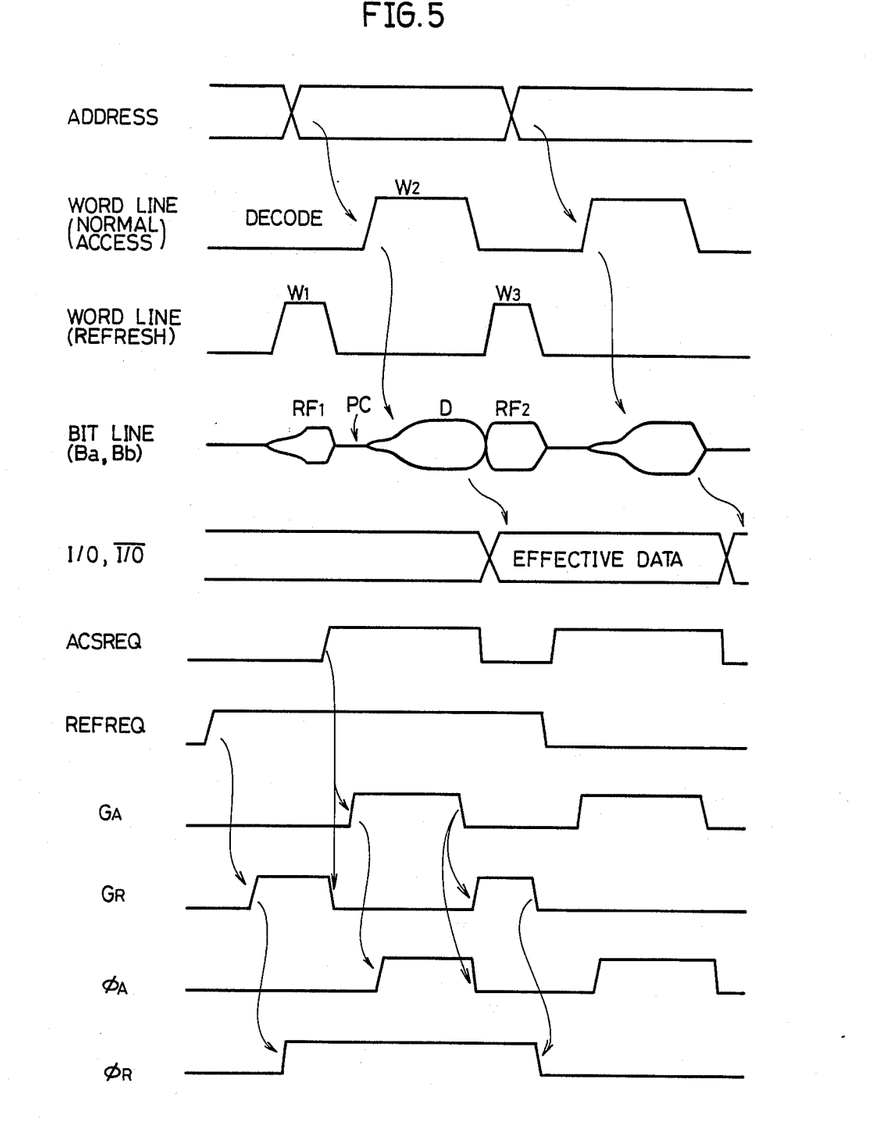
FIG. 5 is a timing chart for explaining an operation of the VSRAM shown in FIG. 3 to occur when a refresh request and a normal access request for different addresses conflict.
Figure 6:
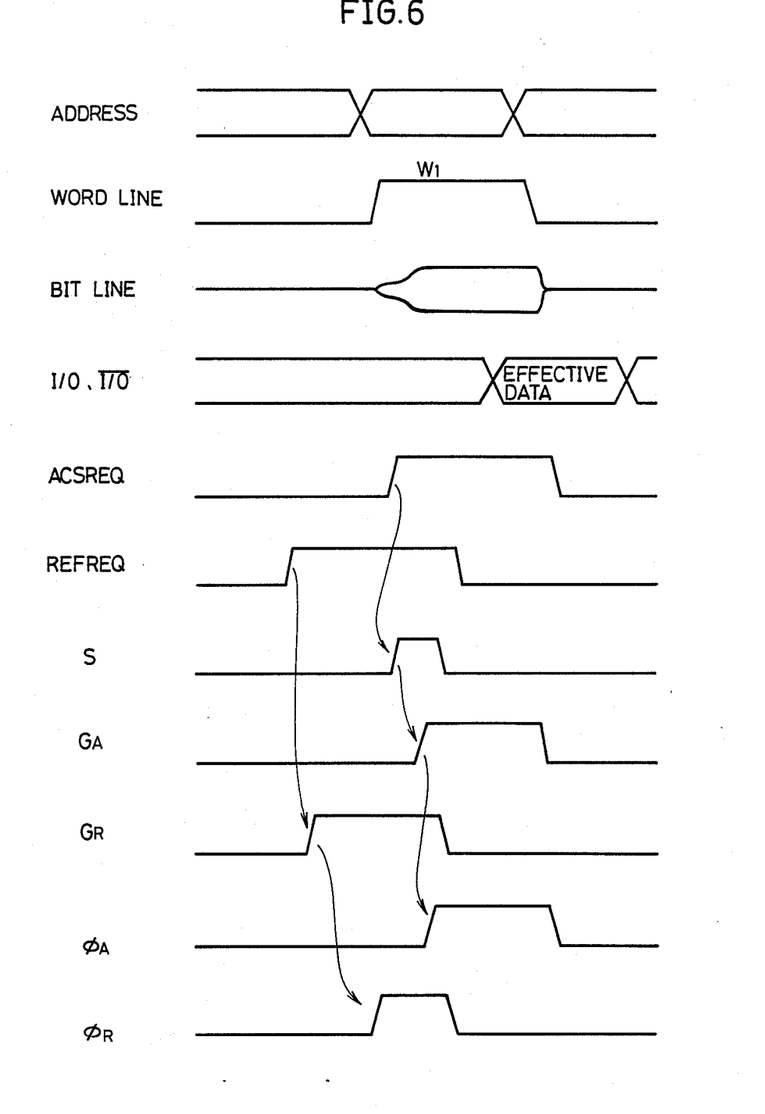
FIG. 6 is a timing chart for explaining the operation of the VSRAM shown in FIG. 3 to occur when a refresh request and a normal access request for the same address conflict.

Referring now to timing charts of FIGS. 5 and 6, description is made on the detailed operation of the VSRAM shown in FIGS. 3 and 4. It is assumed that the refresh request signal REFREQ is applied to the arbiter circuit 11 during the time period in which the memory cells 25a to 25n are released from the normal access. The arbiter circuit 11 shown in FIG. 3 applies the multiplex signal MPX to the address multiplexer 8 when the refresh request signal REFREQ rises. The address multiplexer 8 is switched by the multiplex signal MPX such that the refresh address signal REF from the refresh address counter 9 is applied to the row decoder 3. In addition, the timing generator 6 is responsive to the rise of the refresh request signal REFREQ applied through the arbiter circuit 11 for raising the gate signal $G_R$ from an "L" level to an "H" level. Consequently, the switching transistors 29a and 29b shown in FIG. 4 are turned on. At that time, the gate signal $G_A$ is at the "L" level. Thus, the bit lines Ba and Bb are connected to the refresh sense amplifier 20a and electrically disconnected from the sense amplifier 2a. On the other hand, the row decoder 3 decodes the refresh address signal RFA and selects one of the word lines. It is assumed that the word line Wa shown in FIG. 4 is selected. The row decoder 3 raises potentials on the word line Wa and the dummy word line DW as represented by W1 in FIG. 5. Consequently, data stored in the memory cell 25a is read out to the bit line Ba, and potentials on the bit lines 29a and 29b are transmitted to the refresh sense amplifier 20a. The timing generator 6 raises the activating signal $\phi_R$ from the "L" level to the "H" level. Consequently, the refresh sense amplifier 20a operates, so that the refresh operation is started. The change so far of potentials on the bit lines Ba and Bb are represented by RF1 in FIG. 5.

It is assumed that the column address signal in the normal access is changed and the normal access to the memory cell 25n included in a row address which is different from the row address in which the refresh operation is performed is newly required during the above described refresh operation. The arbiter circuit 11 is responsive to the normal access request signal ACSREQ for switching the multiplex signal MPX applied to the address multiplexer 8. The address multiplexer 8 is responsive to the multiplex signal for applying the row address signal RA applied from the row address buffer 7 through the address coincidence detecting circuit 21 to the row decoder 3. At that time, the address coincidence detecting circuit 21 does not perform a special operation and serves as a mere latch circuit.

On the other hand, the timing generator 6 is responsive to the rise of the normal access request signal ACSREQ for lowering the gate signal $G_R$ to the "L" level and raising the gate signal $G_A$ to the "H" level. Consequently, the switching transistors 29a and 29b are turned off and the switching transistors 28a and 28b are turned on, so that the bit lines Ba and Bb are electrically disconnected from the refresh sense amplifier 20a and connected to the sense amplifier 2a. At that time, the activating signal $\phi_R$ remains at the "H" level, so that the refresh sense amplifier 20a holds data which has already acquired from the memory cell 25a. This is achieved if the refresh sense amplifier 20a is structured by, for example, a flip-flop circuit, similarly to the conventional sense amplifier circuit and the switching transistors 29a and 29b are turned off.

As represented by PC in FIG. 5, the pair of bit lines Ba and Bb is precharged (equalized). The row decoder 3 decodes the row address signal RA and selects the word line Wn. As represented by W2 in FIG. 5, the row decoder 3 raises potentials on the word line Wn and the dummy word line DW. Consequently, the data stored in the memory cell 25n is read out to the bit line Ba, so that the potential on the bit line Ba is changed. Thereafter, the timing generator 6 raises the activating signal $\phi_A$ from the "L" level to the "H" level. Consequently, the sense amplifier 2a operates, so that the potential difference between the bit lines Ba and Bb is amplified as represented by D in FIG. 5. The amplification causes data to be rewritten into the memory cell 25n. Data on the bit lines Ba and Bb are held in the sense amplifier 2a.

Thereafter, the potentials on the word line Wn and the dummy word line DW falls and the gate signal $\phi_A$ attains the "L" level, so that the switching transistors 28a and 28b are turned off. As a result, the sense amplifier 2a is electrically disconnected from the pair of bit lines Ba and Bb. At the time point, the memory cells 25a and 25n are released from the normal access. The pair of bit lines Ba and Bb is precharged.

Thereafter, the timing generator 6 raises the gate signal $G_R$ to the "H" level so that the switching transistors 29a and 29b are turned on, whereby the pair of bit lines Ba and Bb and the refresh sense amplifier 20a are connected. The row decoder 3 raises again the potentials on the word line Wa and the dummy word line DW as represented by W3 in FIG. 5 according to the refresh address signal RFA applied from the refresh address counter 9. Since the refresh sense amplifier 20a continues to hold the data stored in the memory cell 25a, the refresh operation is quickly resumed at that time point. More specifically, as represented by RF2 in FIG. 5, the data held in the refresh sense amplifier 20a is read out to the bit lines Ba and Bb, so that the potential difference between the bit lines Ba and Bb is amplified. When the data on the bit line Ba is rewritten into the memory cell 25a so that the refresh operation is completed, the potentials on the word line Wa and the dummy word line DW fall. The gate signal $G_R$ attains the "L" level and then, the activating signal $\phi_R$ attains the "L" level. In addition, the pair of bit lines Ba and Bb is precharged. Consequently, the VSRAM is ready for acquiring the next normal access.

On the other hand, while the above described refresh resuming operation is performed, the column decoder 4 shown in FIG. 3 selects the pair of bit lines Ba and Bb according to the column address signal Ca applied through the column address buffer 12 and the timing generator 6 and raises the gate signal $GO_\phi$ from the "L" level to the "H" level. Consequently, the I/O gate transistors 27a 27b are turned on, so that the data held in the sense amplifier 2a is applied to the input/output buffer 14 through the input/output lines I/O and $\overline{I/O}$ and further outputted to the input/output pin 15.

As described above, the refresh resuming operation is performed immediately after the memory cells 25a to 25n are released from the normal access, so that the refresh operation is completed before the row address signal RA in the next normal access reaches the address multiplexer 8. Thus, the time loss never occurs, so that the access time is effectively prevented from being longer.

Meanwhile, once the refresh operation is started, it is desirable that the refresh operation is not interrupted until the data read out from the memory cell 25a is acquired in the refresh sense amplifier 20a. The reason is that when data is not acquired in the refresh sense amplifier 20a, the subsequent refresh resuming operation is not smoothly performed. Thus, even if a normal access is required after the refresh operation is started, the normal access must be delayed until the time period required for accepting data in the refresh sense amplifier 20a is elapsed.

However, when a refresh operation is started immediately after the memory cells 25a to 25n are released from one normal access, the rise of the potential on the word line and acquisition of data in the refresh sense amplifier 20a are completed during the output circuit driving time period in the normal access. Consequently, when the normal access is required, the refresh operation is quickly interrupted so that the normal access can be made. As a result, there is no loss time before and after the normal access, so that the access time can be further reduced. In such a case, the timing generator 6 is adapted such that at the time point when the memory cells 25a to 25n are released from the normal access, the address multiplexer 8 is switched such that the refresh address signal RFA from the refresh address counter 9 is applied to the row decoder 3 and the refresh sense amplifier 20 is activated.

Referring now to a timing chart of FIG. 6, description is made on an operation to occur when the normal access is made in conflict with the refresh operation to a memory cell included in the same row address as the row address in which the refresh operation is performed. The case corresponds to the case in which the normal access to the memory cell 25a is required while the refresh operation for, for example, the memory cell 25a is performed in FIG. 4.

The gate signal $G_R$ rises to the "H" level in response to the rise of the refresh request signal REFREQ. Consequently, the switching transistors 29a and 29b are turned on, so that the bit lines Ba and Bb and the refresh sense amplifier 20a are connected. Thereafter, as represented by W1 in FIG. 6, the potential on the word line Wa rises, so that the data stored in the memory cell 25a is read out to the bit line Ba. The activating signal $\phi_R$ rises to the "H" level, so that the refresh operation is started. During the refresh operation, if the normal access to the memory cell 25a is required, the address coincidence detecting circuit 21 is responsive to the rise of the normal access request signal ACSREQ for determining that the row address signal RA and the refresh address signal RFA coincide with each other and raising a coincidence detecting signal S from the "L" level to the "H" level. The timing generator 6 continues to perform the refresh operation until the data stored in the memory cell 25a is acquired in the refresh sense amplifier 20a. When the acquisition is completed, the timing generator 6 raises the gate signal $G_4$ to the "H" level and then, raises the activating signal $\phi_4$ to the "H" level. Consequently, the data on the bit lines Ba and Bb are acquired in the sense amplifier 2a. Since the data has already amplified by the refresh sense amplifier 20a, the sense amplifier 2a substantially serves as a mere latch circuit. The data is rewritten into the memory cell 25a through the pair of bit lines Ba and Bb and outputted through the I/O lines I/O and I/O. Consequently, the memory cell 25a is substantially refreshed. Thus, in this case, the refresh operation need not be resumed by the refresh sense amplifier 20a.

As described in the foregoing, if and when the refresh address signal RFA for performing the refresh operation and the row address signal RA for performing the normal access operation are different from each other, the refresh sense amplifier 20a and the pair of bit lines Ba and Bb are electrically disconnected from each other by the switching transistors 29a and 29b as described above, so that the data acquired in the sense amplifier 20a is prevented from being destroyed. On the other hand, if the refresh address signal RFA and the row address signal RA coincide with each other, the data required in the refresh sense amplifier 20a is transferred to the sense amplifier 2a, so that the data is prevented from being destroyed.

Unlike the above described case, if the refresh operation is required when the normal access is made to any of the memory cells 25a to 25n, the refresh operation is not performed until the memory cells 25a to 25n are released from the normal access operation. In addition, if the normal access is not required during the refresh operation, the refresh operation is performed without interruption, so that the refresh operation is performed at a time from beginning to end.

Although in the above described embodiment, description was made of a case of the normal access for reading out data, the same operation is performed in the case of the normal access for writing data.

In the above described embodiment, when the normal access is required, priority is given to the normal access request. Consequently, if and when the normal access request and the refresh request conflict, the time loss becomes zero or extremely small. Thus, irrespective of the presence or absence of conflict, the access time for the normal access is uniformly reduced. In addition, the data is not destroyed by interruption of the refresh operation at the time of conflict. Furthermore, since an address coincidence detecting circuit is provided, data acquired in the refresh sense amplifier is effectively utilized if the refresh request and the normal access request conflict with respect to the same address.

Since the refresh sense amplifier is provided separately from a sense amplifier for the normal access, the sense amplifier is not used in common in the refresh operation and the normal access operation. Consequently, the buffer register 5 shown in FIG. 1 in which data read out is taken refuge such that the sense amplifier is used earlier for the refresh operation is not required.

Although in the above described embodiment, the present invention is applied to the VSRAM, the present invention can be applied to the whole semiconductor memory device having a self-refresh function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a refresh function, comprising:
   a plurality of memory cells,
   access means including a first sense amplifier for making a normal access to said memory cells,
   said first sense amplifier being activated at the time of said normal access to amplify data read out from said memory cells,
   refresh means including a second sense amplifier for performing a refresh operation for said memory cells,
   said second sense amplifier being activated at the time of said refresh operation to amplify the data read out from said memory cells,
   refresh request means for generating a refresh request signal,
   normal access request means for generating a normal access request signal,
   refresh operation starting means responsive to said refresh request signal for operating said refresh means when said memory cells are released from the normal access by said normal access means,
   refresh operation interrupting means for interrupting the operation of said refresh means and operating said normal access means when said normal access request signal is applied during the operation of said refresh means, and
   data destruction preventing means for holding the data read out from said memory cells in said second sense amplifier such that the data is not destroyed when the operation of said refresh means is interrupted by said refresh operation interrupting means.

2. A semiconductor memory device according to claim 1, which further comprises refresh operation resuming means based on the data held in said second sense amplifier for resuming the refresh operation by said refresh means after said memory cells are released from the normal access by said normal access means.

3. A semiconductor memory device according to claim 2, wherein
   said normal access means comprises first selecting means for generating a first address signal for selecting any of said plurality of memory cells,
   said refresh means comprises second selecting means for generating a second address signal for selecting any of said plurality of memory cells, and which further comprises
   address coincidence detecting means for detecting coincidence of said first address signal generated from said first selecting means and said second address signal generated from said second selecting means, and
   transferring means responsive to determination by said address coincidence detecting means that said first address signal and said second address signal coincide with each other for transferring the data held in said second sense amplifier to said first sense amplifier.

4. A semiconductor memory device having a refresh function and performing a normal access operation and a refresh operation, comprising:

a plurality of memory cells arranged in a plurality of rows and columns, a plurality of word lines each provided corresponding to each row in said plurality of memory cells and used for selecting the memory cells in the row, a plurality of pairs of bit lines each provided corresponding to each column in said plurality of memory cells and used for reading or writing data from or to the memory cells in the column, a plurality of first sense amplifiers each provided corresponding to each of said plurality of pairs of bit lines for amplifying information on said bit lines at the time of said normal access operation, a plurality of second sense amplifiers each provided corresponding to each of said plurality of pairs of bit lines for amplifying data on said bit lines at the time of said refresh operation, a plurality of first switching means each connected between each of said pairs of bit lines and each of said first sense amplifiers, a plurality of second switching means each connected between each of said pairs of bit lines and each of said second sense amplifiers, first address signal generating means for generating a first address signal for selecting any of said plurality of word lines at the time of said normal access operation, second address signal generating means for generating a second address signal for selecting any of said plurality of word lines at the time of said refresh operation, row selecting means responsive to said first address signal from said first address signal generating means or said second address signal from said second address signal generating means for selecting any of said plurality of word lines, normal access request means for generating a normal access request signal, refresh request means for generating a refresh request signal, control means for performing said normal access operation in response to said normal access request signal when said plurality of memory cells are released from said refresh operation, for performing said refresh operation in response to said refresh request signal when said plurality of memory cells are released from said normal access operation, and for performing a second access operation when said normal access request signal is applied during said refresh operation, in said normal access operation, said first address signal from said first address signal generating means being applied to said row selecting means, said first switching means being rendered conductive and said first sense amplifiers being activated, in said refresh operation, said second address signal from said second address signal generating means being applied to said row selecting means, said second switching means being rendered conductive and said second sense amplifiers being activated, in said second access operation, said second switching means being rendered non-conductive with said second sense amplifiers being activated, said second address signal from said second address signal generating means being applied to said row selecting means and said second switching means being rendered conductive after said normal access operation is performed.

5. A semiconductor memory device according to claim 4, which further comprises address coincidence detecting means for determining that said first address signal from said first address signal generating means and said second address signal from said second address signal generating means coincide with each other and generating a coincidence detecting signal when said normal access request signal is applied during said refresh operation, said control means being responsive to said coincidence detecting signal from said address coincidence detecting means for performing a third access operation, in said third access operation, said first switching means being rendered conductive and said first sense amplifier being activated with said second switching means being rendered conductive.

6. A method for controlling a semiconductor memory device comprising a plurality of memory cells, access means including a first sense amplifier for making a normal access to said memory cells, said first sense amplifier being activated at the time of said normal access to amplify data read out from said memory cells, refresh means including a second sense amplifier for performing a refresh operation for said memory cells, said second sense amplifier being activated at the time of the refresh operation to amplify the data read out from said memory cells, refresh request means for generating a refresh request signal, and normal access request means for generating a normal access request signal, which comprises the steps of operating said refresh means in response to said refresh request signal when said memory cells are released from the normal access by said normal access means, interrupting the operation of said refresh means and operating said normal access means with the data read out from said memory cells being held in said second sense amplifier such that the data is not destroyed when said normal access request signal is applied during the operation of said refresh means, and resuming the refresh operation by said refresh means based on the data held in said second sense amplifier after said memory cells are released from the normal access by said normal access means.

7. A method for controlling a semiconductor memory device performing a normal access operation and a refresh operation and comprising a plurality of memory cells arranged in a plurality of rows and columns, a plurality of word lines each provided corresponding to each row in said plurality of memory cells and used for selecting the memory cells in the row, a plurality of pairs of bit lines each provided corresponding to each column in said plurality of memory cells and used for reading or writing data from or to the memory cells in the column, a plurality of first sense amplifiers each provided corresponding to each of said plurality of pairs of bit lines for amplifying information on said bit lines at the time of the normal access operation, a plurality of second sense amplifiers each provided corresponding to each of said plurality of pairs of bit lines for amplifying data on said bit lines at the time of the refresh operation, a plurality of first switching means each connected between each of said pairs of bit lines and each of said first sense amplifiers, a plurality of second switching means each connected between each of said pairs of bit lines and each of said second sense amplifiers, first address signal generating means for generating a first address signal for selecting any of said plurality of word lines at the time of said normal access operation, second address signal generating means for generating a second address signal for selecting any of said plurality of word lines at the time of said refresh operation, row selecting means responsive to said first address signal from said first address signal generating means or said second address signal from said second address signal generating means for selecting any of said plurality of word lines, normal access request means for generating a normal access request signal, and refresh request means for generating a refresh request signal, which comprises the steps of performing said normal access operation in response to said normal access request signal when said plurality of memory cells are released from said refresh operation, performing said refresh operation in response to said refresh request signal when said plurality of memory cells are released from said normal access operation, and performing a second access operation when said normal access request signal is applied during said refresh operation, in said normal access operation, said first address signal from said first address signal generating means being applied to said row selecting means, said first switching means being rendered conductive and said first sense amplifiers being activated, in said refresh operation, said second address signal from said second address signal generating means being applied to said row selecting means, said second switching means being rendered conductive and said second sense amplifiers being activated, in said second access operation, said second switching means being rendered non-conductive with said second sense amplifiers being activated, and said second address signal from said second address signal generating means being applied to said row selecting means and said second switching means being rendered conductive after said normal access operation is performed.

8. A method according to claim 7, comprising the step of determining whether or not said first address signal from said first address signal generating means and said second address signal from said second address signal generating means coincide with each other when said normal access request signal is applied during said refresh operation, said first switching means being rendered conductive and said first sense amplifiers being activated with said second switching means being rendered conductive when both coincide with each other.

* * * * *

UNITED STATES PATENT AND TRADEMARK OFFICE
CERTIFICATE OF CORRECTION

PATENT NO. : 4,829,484

DATED : May 9, 1989

INVENTOR(S) : Kazutami ARIMOTO et al.

It is certified that error appears in the above-identified patent and that said Letters Patent is hereby corrected as shown below:

In Figure 3, at 4, change "ROW DECODER" to --COLUMN DECODER--

Signed and Sealed this

Fifth Day of March, 1991

Attest:

HARRY F. MANBECK, JR.

*Attesting Officer*      *Commissioner of Patents and Trademarks*